United States Patent [19]

Diller

[11] Patent Number: 4,728,813

[45] Date of Patent: Mar. 1, 1988

[54] TIMEBASE GENERATOR WITH IMPROVED LINEARITY AND RECOVERY TIME

[75] Inventor: Calvin D. Diller, Hillsboro, Oreg.

[73] Assignee: Tektronix, Inc., Beaverton, Oreg.

[21] Appl. No.: 905,910

[22] Filed: Sep. 9, 1986

[51] Int. Cl.$^4$ ............................................. H03K 4/50
[52] U.S. Cl. .................................. 307/228; 307/263; 328/183; 328/184; 328/185
[58] Field of Search ............... 307/228, 261, 263, 270; 328/182, 183–185, 187

[56] References Cited

U.S. PATENT DOCUMENTS 4,009,399  2/1977  Hofer ................................. 307/228

OTHER PUBLICATIONS

E. V. Weber, "Retrace Circuit For Character Display", IBM Technical Disclosure Bulletin, vol. 5, No. 11, Apr., 1963, pp. 56–57.

Primary Examiner—John Zazworsky
Attorney, Agent, or Firm—John P. Dellett

[57] ABSTRACT

A timebase generator includes a transistor switch performing a sweep gate function, alternately providing a current path for retrace and then disconnecting such current path to allow generation of a time base ramp. The bias current delivered to the switch is controlled to be at a high level for bringing about proper retrace, but at a low level at the beginning and ending of the time base sweep itself to prevent undesired transients and nonlinearity effects. The low current is maintained from the end of the retrace period until the start of the following retrace period. A baseline stabilizer loop comprises a transistor circuit for accurately predetermining the baseline reference wherein the emitter current of the transistor is controlled to a substantially constant value during operation for enhanced stability. The undesirable effect produced by inherent capacitance of a semiconductor device current source used for charging the timebase generator timing capacitor is neutralized by means of a matching semiconductor device interposed between the timebase generator output and an input electrode of the first mentioned semiconductor device.

21 Claims, 3 Drawing Figures

TIMEBASE GENERATOR WITH IMPROVED LINEARITY AND RECOVERY TIME

BACKGROUND OF THE INVENTION

The present invention relates to time base sweep circuitry and particularly to such circuitry which is adapted to provide a linear sweep with fast recovery.

In a cathode ray oscilloscope or similar device, a varying signal can be displayed as a function of time by applying the signal to vertical deflection means of a cathode ray tube, while a linear sweep signal or time base signal is applied to the horizontal deflection means. Between "sweeps", the horizontal deflection means provides retrace back to the starting point at the left hand side of the cathode ray tube screen, the electron beam generally being blanked out during such retrace period. The horizontal deflection is then held at a stable starting position awaiting the occurrence of the next repetition of the input signal that is to be displayed.

A suitable form of time base circuitry for operating the horizontal deflection means of the cathode ray tube involves a timing capacitor and means for supplying a substantially constant current to the capacitor whereby a linear ramp voltage is provided across the capacitor for application to the aforementioned horizontal deflection means. In a typical circuit, a current switch alternately connects a secondary current path to the timing capacitor for discharging the timing capacitor at the end of each sweep (to provide retrace) and further for establishing bias during baseline stabilization awaiting the beginning of the next sweep. At the beginning of the next sweep, the additional current path is interrupted whereby the timing capacitor is allowed to charge up once again in a linear manner. Large current requirements were imposed upon this secondary current path in order to bring about rapid retrace. Thus, the current from the capacitor during the retrace period may well be five to ten times as much as the current provided thereto during the linear sweep. Unfortunately, at the beginning of a following sweep after retrace, this fairly large current had to be interrupted, i.e. the switch had to be turned off, whereby undesirable transients appeared in the circuit as a consequence of the current interruption and the presence of parasitic inductances and capacitances in the circuit. The result tended to be a non-linear sweep signal especially for very high sweep speeds, as well as interference with the vertical channel signals of the oscilloscope.

The above problem is aggravated when many selectable sweep speeds are desired, while using a comparatively small number of switchable timing capacitors. To obtain a wide range of sweep speeds with few capacitors, it is necessary to apply a large range of selectable currents to the timing capacitors. This inevitably means extremely high current during some retrace periods since fast recovery is required after a sweep is finished. The interruption of these high currents aggravated the problem of undesired transients.

Furthermore, undesirable transients can also occur when the aforementioned current switch turns "on" for discharging the timing capacitor at the beginning of retrace. It would be desirable to eliminate the problems occurring both at the beginning and at the end of the time base sweep.

A further problem with this kind of timebase generator is associated with the stability of circuitry for maintaining an accurate baseline value, or initial starting point, for the time base sweep signal. It would be desirable to establish a very stable initial baseline value.

An additional problem present with the aforementioned type of timebase generator is associated with the current source utilized in charging the timing capacitor during the time base sweep. The current source generally involves a semiconductor device which itself exhibits an inherent capacitance, and the charging current for the latter capacitance subtracts from the current as would otherwise be supplied to the timing capacitor. It would be of advantage to remove this source of inaccuracy.

SUMMARY OF THE INVENTION

In accordance with the present invention, in a particular embodiment thereof, a timebase generator includes a timing capacitor, means for providing a constant current to the timing capacitor for generating a time base sweep, and switching means for coupling a second current path to the timing capacitor in order to establish a retrace period. The switching means has a first or disconnected position during which the timing capacitor is allowed to charge up and provide a linear time base sweep, and a second switching position providing the aforementioned second current path for rapidly discharging the timing capacitor. In accordance with the present invention, an adjustable current source couples a first current through the switching means during the retrace period, and a lower current through the switching means after the retrace period, whereby only the lower value of current needs to be interrupted by the switching means at the beginning of the next time base sweep. Advantageously, the lower value of current is maintained through the next time base sweep, and until the next retrace period, thereby avoiding a pronounced switching transient not only at the beginning of the time base sweep, but also at the end thereof.

In accordance with another feature of the present invention, a baseline stabilizing loop is operative in the period between the end of retrace and the start of the next time base sweep. This stabilizer circuit advantageously comprises a transistor having its emitter connected to the timing capacitor as well as to the switching means terminal coupled to the timing capacitor. An adjustable control loop holds the emitter current at a substantially constant value while the aforementioned adjustable current source supplies a current through the switching means substantially matching the selectable current from the constant current source that was used to charge the timing capacitor during the time base sweep. Consequently the stability of the circuit is enhanced.

According to a further aspect of the present invention, the constant current source utilized for charging the timing capacitor during a time base sweep comprises a semiconductor device, while a second and matching semiconductor device is coupled between the time base sweep output and the first-mentioned semiconductor device to supply current in a reverse sense from the current drawn by the inherent capacitance of the first-mentioned semiconductor device.

It is accordingly an object of the present invention to provide an improved timebase generator for providing a linear output with fast recovery time.

It is another object of the present invention to provide an improved timebase generator which is less prone to the generation of high current switching transients than prior art generators.

It is another object of the present invention to provide improved timebase generator current switching at the beginning and end of each time base sweep signal.

Another object of the present invention is to provide an improved timebase generator having a stable control loop for holding a baseline voltage on the generator timing capacitor between time base sweeps.

It is a further object of the present invention to provide an improved timebase generator wherein current drawn by the inherent capacitance of a semiconductor constant current source, utilized for charging a timing capacitor, is neutralized.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a schematic diagram of a timebase generator circuit in accordance with the present invention, FIG. 2 is a waveform chart illustrating operation of the FIG. 1 circuit, and FIG. 3 is a schematic diagram of a more detailed version of the timebase generator according to the present invention, illustrating additional features.

DETAILED DESCRIPTION

Figure 1:
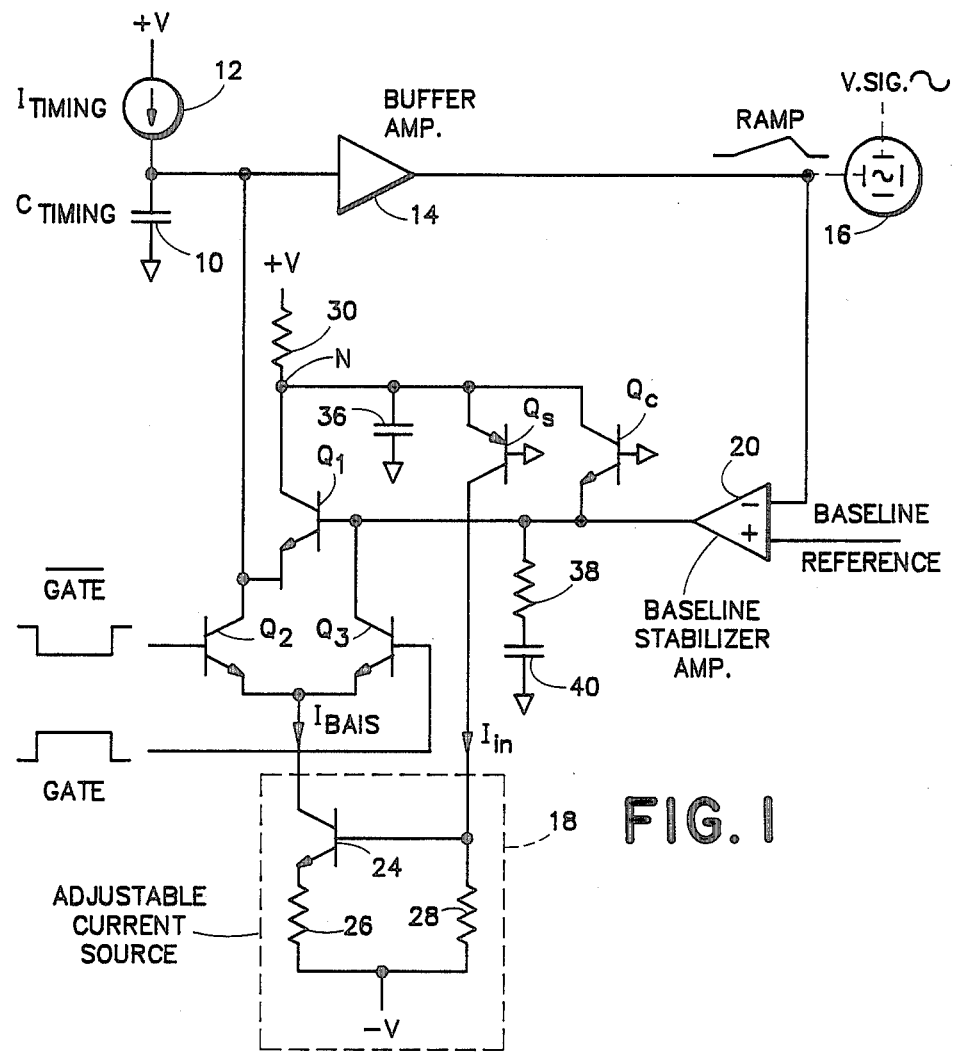

Referring to the schematic diagram of FIG. 1 illustrating a timebase generator according to the present invention, such timebase generator includes a timing capacitor 10 to which current is delivered from a constant current source 12 for the purpose of generating a time base ramp across capacitor 10. The voltage across capacitor 10 is delivered via buffer amplifier 14 to the horizontal deflection circuitry of a cathode ray tube, herein schematically indicated at 16. It will be understood that a vertical input signal is coupled to the vertical deflection means of the cathode ray tube whereby a plot or trace of the vertical input signal, versus time, will be displayed, assuming the ramp signal is a substantially proportional function of time.

The FIG. 1 circuit further includes a current switch comprising transistors $Q_2$ and $Q_3$ functioning as a sweep gate. According to the present invention, the commonly connected emitters of transistors $Q_2$ and $Q_3$ are coupled to an adjustable current source 18. The current switch delivers a "bias" current from source 18 via either the collector of transistor $Q_2$ or the collector of transistor $Q_3$, depending upon the state of the "gate" signals applied to the bases of the transistors. The positive-going gate signal applied to the base of transistor $Q_3$ (and the inverse thereof applied to the base of transistor $Q_2$) is generated in a conventional manner pursuant to a trigger signal or the like. During the presence of the gate signal, the current source 12 and timing capacitor 10 circuit is substantially disconnected from adjustable source 18 inasmuch as transistor $Q_2$ is cut off. At this time, constant current source 12 is allowed to charge timing capacitor 10 thereby providing the ramp function which is amplified in buffer amplifier 14 and delivered to the horizontal deflection circuitry of the cathode ray tube. This action is illustrated in the waveform chart of FIG. 2 (phase 1) where it is seen that during the presence of the gate the ramp runs up providing a linear sweep output. Although only one timing capacitor 10 and only one constant current source 12 are illustrated in FIG. 1, a typical oscilloscope instrument would provide a choice of currents and timing capacitances for generating sweeps of selectable speed.

The end of the time base sweep ramp occurs when the gate signal concludes, usually pursuant to an end-of-sweep signal that turns off the gate when the ramp has risen to some predetermined value. The end-of-sweep circuitry is well known to those skilled in the art and will not be described herein. At the end of the time base sweep in the phase 1 period of FIG. 2, it is necessary to bring about rapid retrace so that the circuitry is ready for the next occurrence of the gate signal which may occur relatively soon after retrace and after the circuitry has returned to original conditions. At the conclusion of the aforementioned gate signal, transistor $Q_2$ is switched on while transistor $Q_3$ is switched off, thereby providing an additional or second current flow path from timing capacitor 10 through transistor $Q_2$ to adjustable current source 18. At this time appreciably more current flows from timing capacitor 10 through transistor $Q_2$ than flowed theretofore in timing capacitor 10 during the sweep. The "bias" current through source 18 overcomes the timing current from source 12, and the voltage across capacitor 10 falls rapidly during the retrace period as illustrated in phase 2 in FIG. 2. In addition to the rapidly falling ramp signal, the increase in $I_{BIAS}$ is illustrated (at 32) in FIG. 2.

The return of the time base sweep ramp signal to its initial level, specified as the baseline value, is detected by baseline stabilizer amplifier 20 in FIG. 1. Amplifier 20 comprises a comparator receiving the ramp output from buffer amplifier 14 on its inverting input lead and receiving a baseline reference voltage on its non-inverting input lead. A stabilizing circuit according to the present invention further includes transistor $Q_1$ having its base driven from the output of amplifier 20 and having its emitter connected to the collector of transistor $Q_2$ whereby, when the retrace of the ramp as illustrated in phase 2 in FIG. 2 reaches the baseline reference, transistor $Q_1$ is caused to conduct and prevent further drop in the voltage across timing capacitor 10. A control loop, including amplifier 20, transistor $Q_1$, and buffer amplifier 14, maintains the voltage across timing capacitor 10 at substantially the baseline reference value. This baseline reference value forms an accurately predetermined starting point for the horizontal trace and is maintained during sweep phase 3. The baseline value is indicated by reference numeral 22 in FIG. 2.

The $I_{BIAS}$ current continues to flow through transistor $Q_2$ until the end of sweep phase 3, whereupon the reoccurrence of the gate signal turns off transistor $Q_2$ and turns on transistor $Q_3$. As during the previous time base sweep, capacitor 10 is then permitted to charge from constant current source 12, and the $I_{BIAS}$ current is diverted via transistor $Q_3$ of the current switch to clamp transistor $Q_C$. The collector of transistor $Q_3$ goes low, rapidly cutting off transistor $Q_1$.

Figure 2:
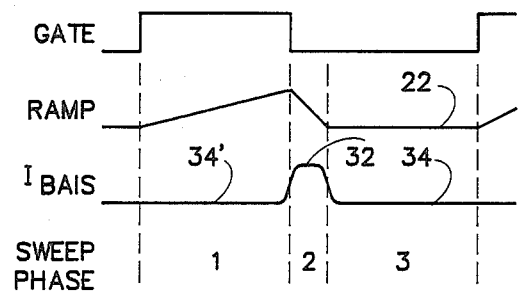

$I_{BIAS}$, rather than comprising a relatively constant value, is instead controlled during the various phases of operation of the circuit so that it will be sufficiently large in sweep phase 2 for bringing about rapid retrace, but will then be reduced in value during at least the subsequent phase 3 in FIG. 2 whereby the current switch does not have to switch a large current from transistor $Q_2$ to transistor $Q_3$ at the beginning of each time base sweep. As a consequence, transient problems and non-linearities are substantially eliminated at the start of the next time base sweep, but the $I_{BIAS}$ current may be made relatively large during sweep phase 2 to bring about proper retrace.

The current $I_{BIAS}$ is produced by adjustable current source 18 comprising transistor 24 having its collector connected in common to emitters of transistors $Q_2$ and $Q_3$, and having its emitter returned to a negative voltage via resistor 26. A junction between the base of transistor 24 and a resistor 28 returning the junction to a negative voltage source receives a current $I_{in}$ from the collector of a transistor $Q_S$ having its emitter connected to the collector of transistor $Q_1$ and having its base grounded. As a consequence, when transistor $Q_1$ is turned on as the retrace of the ramp signal drops to the baseline reference, the collector of transistor $Q_1$ drops, reducing the current through transistor $Q_S$ and causing transistor 24 to reduce the value of the $I_{BIAS}$ current. As will be seen from FIG. 2, $I_{BIAS}$ drops from a relatively high value, depicted by level 32 in FIG. 2 during the retrace period, to a relatively low level, depicted at 34 in FIG. 2, at the conclusion of the retrace period. In a particular circuit, the $I_{BIAS}$ current during phase 2 was approximately 35 ma. while the $I_{BIAS}$ current during phase 3 was on the order of 2 ma. Therefore, transistor $Q_2$ interrupts a much lower current when switching takes place pursuant to the gate signal at the start of the next time base sweep, and a clean ramp beginning is brought about. It will be seen the value of $I_{BIAS}$, during the baseline stabilization period of phase 3, substantially equals the current from current source 12 plus current from transistor $Q_1$.

According to another feature of the invention, the current in the emitter of transistor $Q_1$ is maintained at a substantially constant value during sweep phase 3 of circuit operation. The baseline stabilizer loop including transistor $Q_1$, buffer amplifier 14, and baseline stabilizer amplifier 20, is dependent on the output impedance of transistor $Q_1$ and that impedance varies with emitter current. It is of appreciable benefit for the emitter current of transistor $Q_1$ to be made stable whereby the circuit as a whole can work effectively at different timing currents. In the present embodiment, a further control loop comprises transistor $Q_S$ and adjustable current source 18, whereby the current through transistor $Q_1$ is maintained substantially constant while $I_{BIAS}$ is adjusted to equal the current through transistor $Q_1$ as well as whatever timing current is provided from current source 12 (different for various sweep speed settings of the instrument). Thus, as current through transistor $Q_1$ tends to increase, $I_{BIAS}$ tends to decrease, and vice versa.

According to another feature of the present invention, the current $I_{BIAS}$ is maintained at its lower level until the beginning of retrace in phase 2 in FIG. 2. Transistor $Q_1$ receives its collector current from resistor 30, operating substantially as a current source, while the collector of clamp transistor $Q_C$ is also returned to current source resistor 30 at node N. The clamp transistor $Q_C$ has its base grounded (or connected to a reference voltage) and its emitter connected to the base of transistor $Q_1$ and to the collector of transistor $Q_3$. It will be recalled transistor $Q_3$ is turned on by the gate signal during the time base sweep so as to divert current from transistor $Q_2$. At this time, the collector of transistor $Q_3$ is low, pulling down the base of transistor $Q_1$ for turning off the latter. Transistor $Q_C$ operates as a "catch" transistor or clamp transistor to catch the collector of transistor $Q_3$ and the current $I_{BIAS}$ flows through transistors $Q_3$ and $Q_C$. According to one alternative embodiment, the collector of transistor $Q_C$ could just be connected to a selected reference level. Then when node N would rise at the start of sweep as $Q_1$ turns off, the higher value of the $I_{BIAS}$ current would be brought about at the start of sweep inasmuch as node N is coupled in control relation to the adjustable current source 18 through transistor $Q_S$. Thus, the adjustable current source would go from high current to low current, and reverse, in accordance with the off or on states of transistor $Q_1$. However, in accordance with the preferred embodiment, the collector of transistor $Q_C$ is returned to node N as illustrated. Then, even though transistor $Q_1$ turns off at the beginning of the time base sweep, transistor $Q_3$ being turned on at this time draws current through transistor $Q_C$ from node N and holds node N at a low level. Consequently, the current $I_{BIAS}$ from adjustable current source 18 remains at lower level 34' during sweep phase 1 of FIG. 2, until after the conclusion of the time base sweep when transistor $Q_3$ is turned off by the conclusion of the gate signal. Then, neither transistor $Q_1$ nor transistor $Q_3$ are on, and node N may rise whereby adjustable current source 18 produces the larger $I_{BIAS}$ to accommodate the fast retrace. Therefore, not only does the current switch $Q_2$-$Q_3$ not switch a large current at the beginning of the sweep, it also need not switch a large current at the end of the sweep, and a switching transient is avoided at this time also. At the end of the sweep, the rise of node N is delayed slightly by capacitor 36 returned to ground, but $I_{BIAS}$ rises rapidly enough to produce the desired retrace. Of course it is immaterial whether the retrace waveform is absolutely linear since it is not seen. Correct baseline stabilizer loop phase margins are established by series combination of resistor 38 and capacitor 40 interposed between the output of amplifier 20 and ground.

Figure 3:
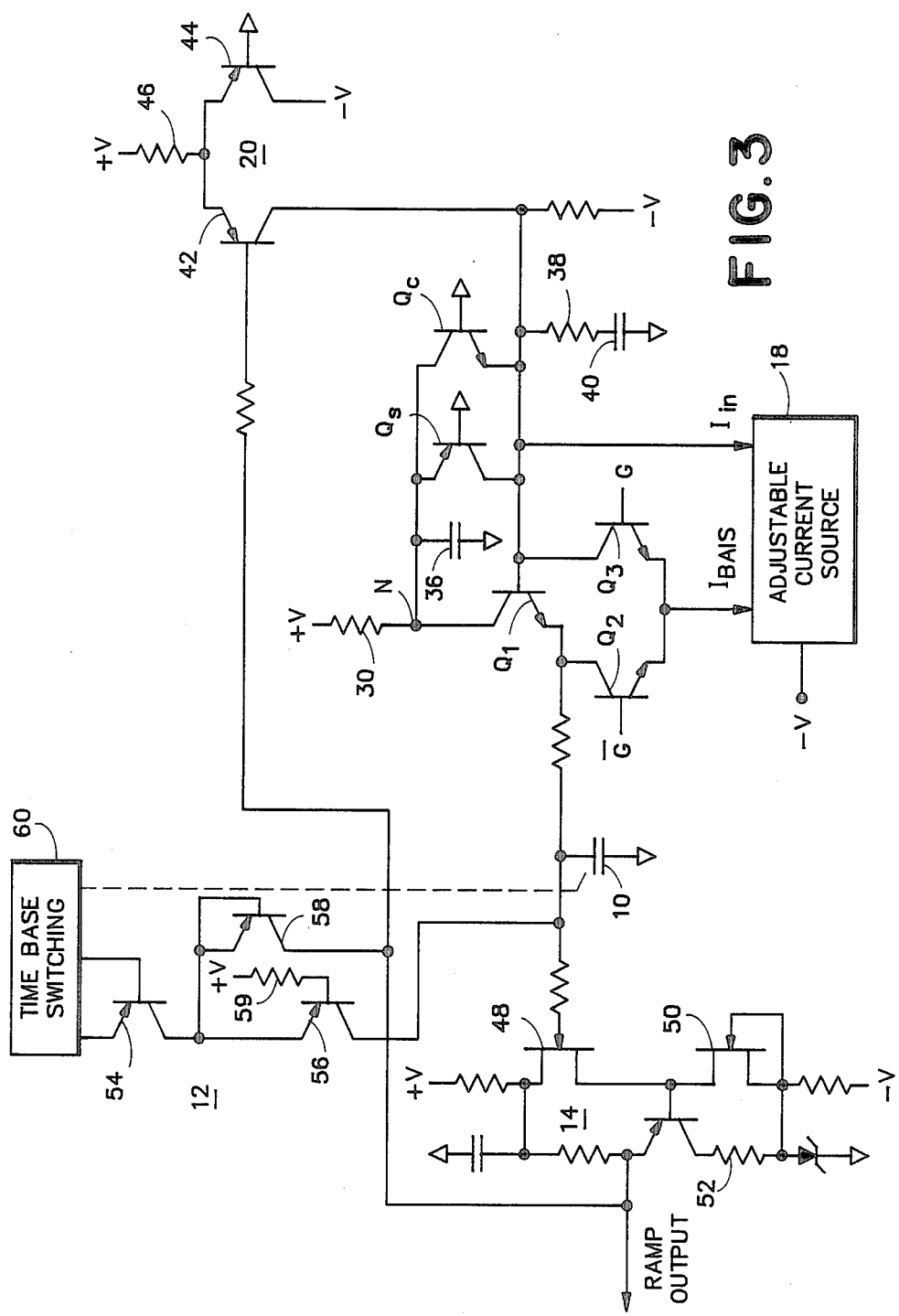

Turning now to the more detailed schematic diagram of FIG. 3, illustrating portions of the circuit in somewhat greater detail, the baseline stabilizer amplifier 20 comprises a differential amplifier including common emitter connected transistors 42 and 44, wherein the emitters are returned to a positive voltage through resistor 46. The collector of the transistor 44 is coupled to a negative voltage and the collector of transistor 42 is connected to the base of transistor $Q_1$ for bringing about turn on of transistor $Q_1$ when the retrace reaches the baseline reference. The baseline reference is provided by the base connection of transistor 44, here shown to be ground. However, the baseline reference voltage can be some other voltage value as desired. The same reference value is suitably connected to the base of clamp transistor $Q_C$. The base of transistor 42 receives the ramp output from buffer amplifier 14 for comparison purposes as hereinbefore explained.

Buffer amplifier 14 includes a first FET 48 coupled to timing capacitor 10, and has its drainsource path connected in series with FET 50 in a well known manner to provide a constant current source to accomplish zero offset with unity gain. FET 48 drives transistor 52, and the ramp output is taken from the emitter of transistor 52. The buffer amplifier circuit acts as a voltage follower with a one diode drop offset for reasons which will shortly become evident.

Current source 12 comprises a current source transistor 54 having its collector connected to the emitter of a transistor 56 which operates as a cascode device. The collector of transistor 56 is connected to timing capacitor 10 for supplying the charging current thereto during the time base sweep. The base of transistor 56 is returned to a positive voltage through resistor 59.

The emitter and base of transistor 54 are provided with various emitter resistances and input currents from time base switching circuit 60. The latter may be digitally operated for selecting the charging current for timing capacitor 10 and therefore controlling the sweep speed. Also, the value of capacitor 10 may be selected via time base switching circuit 60 through control of the coupling of one or more time base capacitors in circuit at the location illustrated in FIG. 3 for capacitor 10. Such switching circuits are well known to those skilled in the art.

As hereinbefore mentioned, the semiconductor device which provides the constant current to timing capacitor 10, i.e. transistor 56 in this case, has an inherent capacitance which draws a current subtracting from the timing current and resulting in a slower than expected sweep. This inherent capacitance comprises the collector-base capacitance of transistor 56. However, in accordance with the present circuit, a matching transistor 58 is provided having its collector connected to the ramp output of buffer amplifier 14, and having its emitter and base connected to the emitter of transistor 56. Transistor 58 never conducts. However, the current due to transistor 58's collector-base capacitance enters transistor 56's emitter and adds to the timing current. Since transistors 56 and 58 are of the same type the capacitance related currents should substantially cancel. Moreover, the transistors 56 and 58 are operated at the same bias. Note that the buffer amplifier 14 operates as a voltage follower with a one diode drop offset attributable to transistor 52. The voltage present on the output of buffer amplifier 14, when fed to the collector of transistor 58, results in a collector-base voltage on transistor 58 which matches the collector-base voltage on transistor 56. Therefore, the capacitance related currents contributed by transistors 56 and 58 can substantially cancel resulting in approximately zero effective capacitance at the collector of transistor 56. This eliminates the effects of non-linear collector-base capacitance of the current source semiconductor device upon output ramp linearity.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A circuit for producing a time base sweep comprising:
   a timing capacitor,
   first current source means for providing a current in a first current flow direction relative to said capacitor for successively generating a time base sweep,
   second current source means and means for coupling a current from said second current source means in a second current flow direction relative to said capacitor for establishing a retrace at the end of each time base sweep and for decoupling the same subsequent to the end of retrace for initiating another sweep, and
   means for reducing said last mentioned current from said second current source means to a lower level of current magnitude during a period after retrace and at least until the beginning of the next time base sweep.

2. The circuit according to claim 1 wherein said last mentioned current is reduced until the next retrace.

3. The circuit according to claim 1 further including means for stabilizing the voltage on said capacitor at a predetermined level after said retrace and until the beginning of the next time base sweep, said means for coupling a current in said second current flow direction functioning to divert current from said capacitor until said beginning of the next time base sweep.

4. A circuit for producing a repetitive time base sweep, comprising:
   a timing capacitor,
   means for providing a current to said timing capacitor for generating a time base sweep,
   switching means for also coupling a second current path to said timing capacitor for establishing a retrace period, a time base sweep being initiated by actuation of said switching means to divert said second current path from said timing capacitor, and
   means for providing a first current through said switching means during said retrace period, and for providing a second and lower current through said switching means after said retrace period.

5. The circuit according to claim 4 wherein said second current is provided to said switching means substantially until a next retrace period.

6. In a circuit for producing a repetitive time base sweep, said circuit including a timing capacitor, means for changing the charge on said capacitor for providing a time base sweep signal starting from an initial baseline value, and means for reversing said change in charge on said capacitor at the end of the time base sweep to provide a retrace period concluding with return to said initial baseline value, said last mentioned means including a current switch having a first switching position during the time base sweep and a second switching position for providing an additional current path to said capacitor substantially at the end of the time base sweep and until the beginning of the next time base sweep, the improvement comprising:
   means for supplying a first value of current through said current switch during said retrace period, and a lower value of current through said current switch thereafter so that said lower value of current is present when said current switch returns to said first switching position for initiation of the next time base sweep.

7. The apparatus according to claim 6 wherein said means for supplying the current through said current switch returns to supplying said first value of current substantially at the end of a next time base sweep.

8. The apparatus according to claim 6 further including means for stabilizing the voltage on said capacitor upon said return to said baseline value until the beginning of the next time base sweep.

9. The apparatus according to claim 8 further including circuit means responsive to said stabilizing means for causing return of a said lower value of current from said means for supplying the same commensurate with the current delivered from said means for changing the charge on said capacitor.

10. The apparatus according to claim 8 wherein said current switch comprises a pair of emitter coupled transistors, said stabilizing means including a third transistor having its emitter coupled to said capacitor as well as to the collector of a first of said pair of transistors.

11. The apparatus according to claim 10 wherein said means for supplying a first value of current and a lower value of current through said current switch comprises an adjustable current source responsive to operation of said third transistor when the retrace of said sweep signal reaches said baseline value to change from supplying the first value of current to said lower value of current.

12. The apparatus according to claim 11 wherein said adjustable current source is responsive to the operation of said third transistor to supply a said lower value of current commensurate with the current delivered from said means for changing the charge on said capacitor so as to maintain the current from the emitter of said third transistor at a substantially predetermined value when the sweep signal has returned to baseline value.

13. The apparatus according to claim 11 wherein the collector of a second of said pair of transistors is coupled to the base of said third transistor, and further including means coupling the collector of said third transistor in control relation to said adjustable current source, a clamp transistor interposed between the collector and base of said third transistor, and a current source resistor coupled to the collector of said third transistor, whereby said adjustable current source continues to supply said lower value of current until current is not being diverted from said current source resistor through said clamp transistor and the second of said pair of transistors.

14. The apparatus according to claim 6 wherein said means for changing the charge on said capacitor comprises a semiconductor device functioning as a source of current for said timing capacitor, said semiconductor device having an inherent capacitance that reduces the current that would otherwise be provided to said timing capacitor, and means for providing a compensating current for said timing capacitor.

15. The apparatus according to claim 14 wherein said semiconductor device comprises a transistor connected as a cascode device driving said timing capacitor, said inherent capacitance comprising the collector-base capacitance of said transistor, and wherein said means for providing a compensating current comprises a second transistor having a collector-base capacitance connected in driving relation to the emitter of the first mentioned transistor, and means coupling an output of said sweep circuit for driving the collectorbase capacitance provided by said second transistor for supplying additional current to said timing capacitor.

16. The apparatus according to claim 15 further provided with an output buffer amplifier interposed between said timing capacitor and said output of said sweep circuit, said buffer amplifier having a diode drop offset matching the offset provided by said second transistor.

17. A circuit for producing a time base sweep, said circuit including a timing capacitor and means for providing a current to said capacitor for generating a time base sweep, wherein said means for providing a current comprises a semiconductor device having an inherent capacitance that reduces the current that would otherwise be provided to said timing capacitor, and means for providing a compensating current to said timing capacitor to neutralize the current lost to the inherent capacitance of said semiconductor device.

18. The apparatus according to claim 17 wherein said semiconductor device comprises a transistor connected as a cascode device driving said timing capacitor, said inherent capacitance comprising the collector-base capacitance of said transistor, and wherein said means for providing a compensating current comprises a second transistor having a collector-base capacitance coupled between an output of said sweep circuit and the emitter of the first mentioned transistor.

19. The apparatus according to claim 18 further provided with an output buffer amplifier receiving the voltage on said timing capacitor as an input and providing said output, said buffer amplifier having a diode drop offset matching the offset provided by said second transistor.

20. The method of operating a time base sweep circuit in response to a gating signal, wherein said circuit includes a timing capacitor, means for providing a time base sweep beginning from an initial value, and means for providing a second current path to said capacitor comprising the steps of:

coupling said additional current path to said capacitor for providing a retrace period back to said initial value in response to a given portion of said gating signal, susequently decoupling said additional current path from said capacitor for the subsequent initiation of a following time base sweep in response to another portion of said gating signal, and limiting the current in said additional current path to a level lower than during retrace substantially at the end of each said retrace period at starting substantially at the end of each said retrace period and continuing at least until said additional current path is subsequently decoupled for the initiation of the following time base sweep.

21. The method according to claim 20 wherein said current in said additional current path is limited until substantially the beginning of the next retrace period.

* * * * *